United States Patent
Mikami et al.

(10) Patent No.: US 7,022,606 B2
(45) Date of Patent: Apr. 4, 2006

(54) UNDERLAYER FILM FOR COPPER, AND A SEMICONDUCTOR DEVICE INCLUDING THE UNDERLAYER FILM

(75) Inventors: Noboru Mikami, Tokyo (JP); Hideaki Machida, Yamanashi (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 103 days.

(21) Appl. No.: 10/732,798

(22) Filed: Dec. 11, 2003

(65) Prior Publication Data

US 2004/0137726 A1    Jul. 15, 2004

(30) Foreign Application Priority Data

Dec. 11, 2002   (JP)   .............................. 2002-359525

(51) Int. Cl.
*H01L 21/44*   (2006.01)

(52) U.S. Cl. .................. 438/687; 438/627; 438/643

(58) Field of Classification Search ................ 257/751, 257/762; 438/627, 643, 687
See application file for complete search history.

(56) References Cited

U.S. PATENT DOCUMENTS

| | | | | |
|---|---|---|---|---|
| 5,677,545 | A * | 10/1997 | Shi et al. ....................... | 257/40 |
| 6,323,131 | B1 * | 11/2001 | Obeng et al. ............... | 438/687 |
| 6,905,958 | B1 * | 6/2005 | Gracias et al. .............. | 438/643 |
| 2004/0245518 | A1 * | 12/2004 | Ramanath et al. ............. | 257/9 |
| 2005/0093162 | A1 * | 5/2005 | Gracias ...................... | 257/759 |

OTHER PUBLICATIONS

Ramanath et al., Self-assembled subnanolayers as interfacial adhesion enhancers and diffusion barriers for integrated circuits, *Appl. Phys. Lett.*, 83 (Jul. 2003) 383.*

Semaltianos et al., Copper chemical vapour deposition on organosilane-treated $SiO_2$ surfaces, *Appl. Surf. Sci.*, 222 (2004) 102.*

Doppelt et al., High affinity self-assembled monolayers for copper CVD, *Microelectronic Engineering*, 76 (2004) 113.*

Applied Physics Letters, vol. 78, No. 17, "Self-Assembled Near-Zero-Thickness Molecular Layers as Diffusion Barriers for Cu Metallization", A. Krishnamoorthy, et al., Published by American Institute of Physics, Apr. 23, 2001, pp. 2467-2469.

* cited by examiner

*Primary Examiner*—Christian D. Wilson
(74) *Attorney, Agent, or Firm*—Leydig, Voit & Mayer, Ltd.

(57) ABSTRACT

An underlayer film-forming material for copper, a method for forming the underlayer, an underlayer film for copper, and a semiconductor device including a substrate, the underlayer and copper wiring film, which prevents copper diffusion as well as provides superior adhesion to a copper wiring film, even if the film is thinner than conventional barrier metals. The underlayer film-forming material for copper is formed from a compound represented by a $(R_1R_2)P$—$(R)_n$—$Si(X_1X_2X_3)$, wherein at least one of $X_1$, $X_2$, and $X_3$ represents a hydrolysable group; each of $R_1$ and $R_2$ represents an alkyl group; R represents a divalent linear organic group which is selected from an alkylene group, an aromatic ring, and an alkylene group including an aromatic ring; and n is an integer from 1 to 6.

3 Claims, 1 Drawing Sheet

UNDERLAYER FILM FOR COPPER, AND A SEMICONDUCTOR DEVICE INCLUDING THE UNDERLAYER FILM

TECHNICAL FIELD

The present invention relates to an underlayer film-forming material for copper, a method for forming a copper underlayer film, an underlayer film for copper, and a semiconductor device, and more specifically to an underlayer film-forming material for copper, a method for forming an underlayer film for copper, an underlayer film for copper, and a semiconductor device, which can prevent copper diffusion even when the thickness of the underlayer film is thinner than that of conventional barrier metals, and which enable superior adhesion to copper wiring film.

BACKGROUND OF THE INVENTION

In recent years, the development of LSI technology has been significant, and the size of LSIs is becoming even-smaller. Thus, the width of wiring through which signals are transmitted is also getting smaller, i.e., wirings are becoming ultrathin. As the resistance values of conventional Tungsten (W) films and Aluminium (Al) films are unable to withstand this thinning of the wire, the adoption of copper (Cu), which has a low resistance value, has been suggested.

However, the adoption of copper film, with its lower resistivity causes several problems that do not occur in the case of adopting W or Al film. One problem is that copper diffuses to the circumference of the LSI, and when this happens the function of the LSI is largely lost.

Therefore, a method was proposed for forming an alloy film for preventing copper diffusion (a barrier metal: TiN, TaW, ZrN, VN, TiSiN, etc.) as an underlayer film on a substrate (for example, see "The latest developments in copper wiring technology", Realize Corporation, May 30th, 1998, pp. 3–171).

There is, however, a lower limit on the thickness of such alloy film that allows the alloy film to efficiently function as a barrier metal. If the thickness is below the lower limit, the alloy film does not function as a barrier metal. On the other hand, the width of copper wiring is predicted to fall below 0.1 μm in the future. Therefore, if the thickness of the barrier metal cannot be further reduced, the thickness of the copper wiring film alone will have to be reduced, and when this is coupled with the prediction that the width of the copper wiring will be under 0.1 μm in the future, the cross-sectional area of the copper wiring will become too small, which makes the adoption of copper with low resistivity meaningless. In other words, the limitations of alloy films such as mentioned above are becoming apparent.

Another problem is that the adhesion of conventional barrier metals to copper is inferior. For example, a copper film (a plated copper film or a CVD copper film) readily peels off from either a Si or $SiO_2$ underlayer film. In particular, the adhesion characteristics between a copper film and an underlayer film are reported to be worst in the case where a Tantalum(Ta)-based film, which is considered to be the most efficient of the above-mentioned barrier metals is arranged as the underlayer film. In this case, the copper film may even peel off as it forms on the Ta-based film.

Therefore, it is an object of the present invention to solve the problems such as those mentioned above which exist in conventional barrier metals, and to provide an underlayer film-forming material for copper, a method for forming an underlayer film for copper, an underlayer film for copper, and a semiconductor device, which enable the prevention of copper diffusion even if the thickness of underlayer film is thinner than that of conventional barrier metals, and which enable superior adhesion to copper wiring film.

SUMMARY OF THE INVENTION

The inventor of the present invention has carried out extensive research and development to solve the above problems, and has discovered that a molecular film made of organophosphorus-silicon based $[(R_1R_2)P\text{—}(R)_n\text{—}Si\text{—}O\text{—}]$, which will be explained hereinafter, prevents copper diffusion even with a thickness of several tens of Å and has superior adhesion to copper film.

Therefore, according to the present invention, there is provided an underlayer film-forming material for copper, characterized by containing a compound represented by the following general formula [I].

$(R_1R_2)P\text{—}(R)_n\text{—}Si(X_1X_2X_3)$     General formula [I]

In the general formula [I], at least one of $X_1$, $X_2$, and $X_3$ represents a hydrolysable group; each of $R_1$ and $R_2$ represents an alkyl group; R represents a divalent linear organic group which is formed of an alkylene group, an aromatic ring, or an alkylene group including an aromatic ring; and n represents an integer of 1 to 6.

Further, according to the present invention, there is provided a method for forming an underlayer film for copper, characterized by including a process of bringing an underlayer film-forming material for copper containing the compound represented by the above general formula [I] into contact with a surface of a substrate.

Further, according to the present invention, there is provided an underlayer film for copper, arranged on a substrate, characterized in that the underlayer film for copper is formed such that a $(R_1R_2)P\text{—}(R)_n\text{—}Si$ group bonds to a substrate via a Si—O bond. [Note that in the above formula, $R_1$, $R_2$, R, and n are defined in the same manner as described above.]

Further, according to the present invention, there is provided a semiconductor device equipped with: a substrate; an underlayer film for copper arranged on the substrate; and a wiring film made up mainly of copper arranged on said underlayer film for copper, with said semiconductor device characterized in that the underlayer film for copper is formed such that a $(R_1R_2)P\text{—}(R)_n\text{—}Si$ group bonds to the substrate via a Si—O bond.

[Note that in the above formula, $R_1$, $R_2$, R, and n are defined in the same manner as described above.]

BRIEF DESCRIPTION OF THE DRAWINGS

The FIGURE shows a schematic view for illustrating a film-forming apparatus (MOCVD).

DETAILED DESCRIPTION OF THE INVENTION

Figure 1:
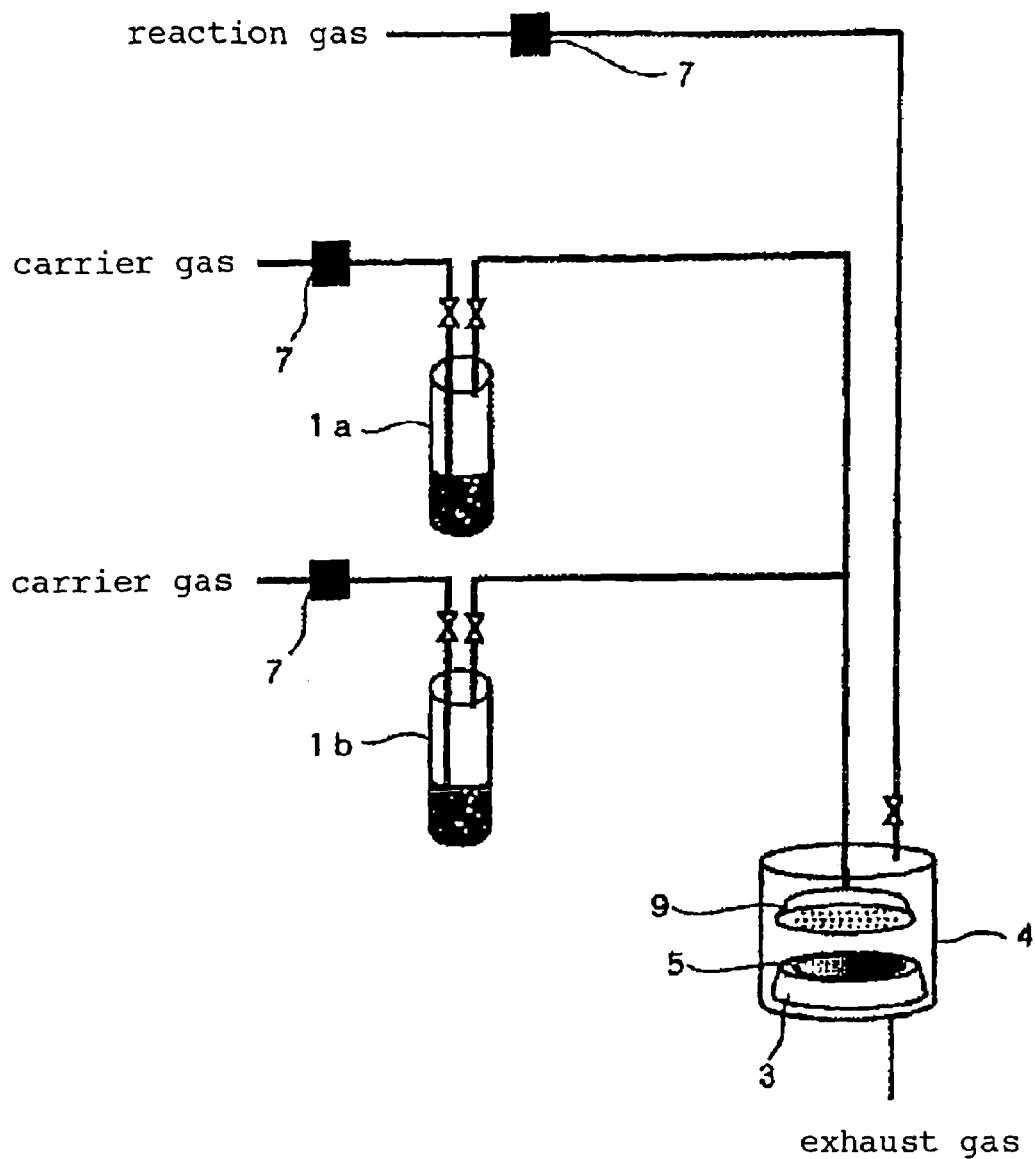

An underlayer film-forming material for copper wiring film according to the present invention contains a compound represented by the following general formula [I].

$(R_1R_2)P\text{—}(R)_n\text{—}Si(X_1X_2X_3)$     General formula [I]

In the above general formula [I], at least one of $X_1$, $X_2$, and $X_3$ represents a hydrolysable group; each of $R_1$ and $R_2$ represents an alkyl group; R represents a divalent linear organic group which is formed of an alkylene group, an aromatic ring, or an alkylene group including an aromatic ring; and n represents an integer of 1 to 6.

The compound represented by the above general formula [I] is a hydrolysable compound which reacts with —OH on the surface of a substrate to generate a free HX and a [$(R_1R_2)P$—$(R)_n$—Si—O-substrate)].

In the above general formula [I], $X_1$, $X_2$, and $X_3$ are preferably selected from the group consisting of a halogen, an alkoxide group, an amino group and an isocyanate group respectively.

Further, for each of $R_1$ and $R_2$ it is particularly preferably for their alkyl groups to have 1 to 21 carbon atoms. Of these, alkyl groups each having 1 to 14 carbon atoms are more preferable.

Further, for R it is particularly preferable for the group to have 1 to 50 carbon atoms. Of these, a group having 1 to 5 carbon atoms is more preferable.

Among the compounds represented by the general formula [I],
1-dimethylphosphino-2-triethoxysilylethane,
1-diethylphosphino-2-triethoxysilylethane,
1-diphenylphosphino-2-triethoxysilylethane,
1-dimethylphosphino-2-trimethoxysilylethane,
1-diethylphosphino-2-trimethoxysilylethane,
1-diphenylphosphino-2-trimethoxysilylethane,
1-dimethylphosphino-3-triethoxysilylpropane,
1-diethylphosphino-3-triethoxysilylpropane,
1-diphenylphosphino-3-triethoxysilylpropane,
1-diphenylphosphino-2-trichlorosilylethane,
1-diphenylphosphino-2-trisdimethylaminosilylethane,
1-diphenylphosphino-2-triisocyanatesilylethane, and
1-diphenylphosphino-4-triethoxysilylethylbenzene are preferable.

A method for forming an underlayer film for copper according to the present invention is a method for forming an underlayer film for copper on a substrate to be provided with a copper film, in which the above underlayer film-forming material for copper comes in contact with a surface of the substrate. In particular, the method according to the present invention is a method for forming an underlayer film for copper wiring film on a substrate to be provided with copper wiring film, the method including a process of bringing the above underlayer film-forming material for copper into contact with a surface of the substrate, preferably further including a process of removing reaction by-product(s) generated during the preceding process from the surface of the substrate.

The underlayer film for copper according to the present invention, for example, is formed such that the $(R_1R_2)P$—$(R)_n$—Si group thereof bonds to the substrate via a Si—O bond. Such a structure may be obtained by immersing the substrate into a solution containing a compound represented by the general formula [I] and a solvent. The compound is preferably incorporated into the solution at a concentration of about 1% by volume.

Immersing the substrate into the solution containing the compound represented by the general formula [I] leads to a reaction in a liquid phase between —OH on the surface of the substrate and —$Si(X_1X_2X_3)$ of the above compound, to readily yield a substrate to which a $(R_1R_2)P$—$(R)_n$—Si group bonds via a Si—O bond.

Alternatively, a gas phase method may be used instead of the liquid phase method. For example, transporting the above compounds to the surface of the substrate by CVD also leads to the reaction in a gas phase between —OH on the surface of the substrate and —$Si(X_1X_2X_3)$ of the above compound, to readily yield a substrate to which a $(R_1R_2)P$—$(R)_n$—Si group bonds via a Si—O bond.

Furthermore, a method other than the above is as follows. Adding the above compound into a supercritical fluid and then introducing a substrate into said fluid also readily yields a substrate to which a $(R_1R_2)P$—$(R)_n$—Si group bonds via a Si—O bond.

Note that the reaction between —OH on the surface of the substrate and —$Si(X_1X_2X_3)$ is, for reaction efficiency, preferably carried out at conditions from room temperature (e.g., 25° C.) to 450° C.

Note that the process of removing reaction by-products from the surface of the substrate may be performed by, for example, washing the substrate using the same solvent as the reaction solvent to remove the by-product(s) produced in the reaction between —OH on the surface of the substrate and —$Si(X_1X_2X_3)$, and further baking the substrate to remove the residual solvent.

Further, the underlayer film for copper according to the present invention is formed such that a $(R_1R_2)P$—$(R)_n$—Si group bonds to the substrate via a Si—O bond. The underlayer film for copper may be obtained easily in accordance with the above-described method for forming underlayer film for copper of the present invention.

The thickness of the underlayer film for copper is, for example, 1 to 3 nm.

A semiconductor device according to the present invention is equipped with: a substrate; an underlayer film for copper arranged on the substrate; and a wiring film made up mainly of copper and provided on the underlayer film for copper, and in the semiconductor device, the underlayer film for copper is formed such that a $(R_1R_2)P$—$(R)_n$—Si group bonds to the substrate via a Si—O bond.

EXAMPLES

Hereinafter the present invention will be explained in more detail with reference to the examples.

Example 1

A silicon substrate with a $SiO_2$ thermal oxide film formed on its surface was used as a substrate. The substrate, having its surface subjected to a Si—OH termination treatment, was immersed into a 1% by volume toluene solution of 1-diphenylphosphino-2-triethoxysilylethane heated to 60° C. for 1 hour. After 1 hour, the substrate was taken out of the solution, washed with toluene, and dried. Subsequently, the substrate was heated at 120° C. for 4 minutes to remove the residual solvent and byproduct.

The surface of the substrate obtained as above was measured using a reflectometer. The measurement showed that a nearly uniform thin film having a thickness of 1.2 nm was formed.

While measuring the thin film using FT-IR, peaks corresponding to $Ph_2PCH_2CH_2SiO$— (where Ph represents a phenyl group) were observed.

After the formation of the thin film, a copper thin film having a thickness of 100 nm was formed by the CVD method using a hexafluoracetylacetonate copper trimethylvinylsilane adduct as a source material.

The copper thin film was subjected to a tape peeling test to determine adhesion to the underlayer film. In contrast to the copper thin film peeling off in the case of conventional barrier metals, in this example no peeling was observed.

The substrate was also subjected to the Backside SIMS to determine the copper diffusion to the underlayer film although no copper diffusion was observed.

Examples 2–13

The procedure of Example 1 was repeated except that, instead of 1-dimethylphosphino-2-triethoxysilylethane used in Example 1,
1-dimethylphosphino-2-triethoxysilylethane (Example 2),
1-diethylphosphino-2-triethoxysilylethane (Example 3),
1-dimethylphosphino-2-trimethoxysilylethane (Example 4),
1-diethylphosphino-2-trimethoxysilylethane (Example 5),
1-diphenylphosphino-2-trimethoxysilylethane (Example 6),
1-dimethylphosphino-3-triethoxysilylpropane (Example 7),
1-diethylphosphino-3-triethoxysilylpropane (Example 8),
1-diphenylphosphino-3-triethoxysilylpropane (Example 9),
1-diphenylphosphino-2-trichlorosilylethane (Example 10),
1-diphenylphosphino-2-trisdimethylaminosilylethane (Example 11),
1-diphenylphosphino-2-triisocyanatesilylethane (Example 12), and
1-diphenylphosphino-4-triethoxysilylethylbenzene (Example 13) were used.

As a result, a thin film having a thickness of 1.2 to 2.2 nm in which a $(R_1R_2)P-(R)_n-Si$ group bonds to the substrate via a Si—O bond was formed in each of the examples. The adhesion of the copper thin film was examined for each example using the tape peeling test. In the test, peeling of the copper thin film was not observed in any of the examples. The copper diffusion to the underlayer film was also examined using the Back side SIMS for each example, but no copper diffusion was observed in any of the examples.

Examples 14–26

Instead of the silicon substrate a $SiO_2$ thermal oxidation film formed on its surface, a silicon substrate having an alkylsilicon-based film with a low dielectric constant was used in each of Examples 1 to 13, and was subjected to a similar process as above.

As a result, a thin film having a thickness of 1.2 to 2.2 nm in which a $(R_1R_2)P-(R)_n-Si$ group bonds to the substrate via a Si—O bond was formed in each of the examples. The adhesion of the copper thin film was examined for each example using the tape peeling test. In the test, peeling of the copper thin film was not observed in any of the examples. The copper diffusion to the underlayer film was also examined using the Back side SIMS for each example, but no copper diffusion was observed in any of the examples.

Example 27

The FIGURE is a schematic view for illustrating a film-forming apparatus (MOCVD). In the FIGURE the film-forming apparatus includes source material containers 1a and 1b, a heater 3, a decomposition reactor 4, a substrate 5, gas flow controllers 7, and a gas blowout shower head 9.

The source material container 1a contains 1-dimethylphosphino-2-trimethoxysilylethane kept at 90° C. The source material container 1b contains water kept at room temperature. Argon serving as a carrier gas was introduced into the source material containers 1a and 1b at a rate of 1 to 10 ml/min respectively. The pressure in the decomposition reactor 4 was kept at 1 to 100 Pa, and the temperature of the substrate 5 was kept at 40 to 200° C. The film formation was carried out by introducing water vapor to the decomposition reactor 4 to hydroxylate the surface of the substrate, followed by introducing vapor of 1-dimethylphosphino-2-trimethoxysilylethane to the reactor.

The surface of the substrate 5 obtained as above was measured using a reflectometer. The measurement showed that a nearly uniform thin film having a thickness of 1.2 nm was formed.

In examining the thin film using FT-IR, peaks corresponding to $(Me)_2PCH_2CH_2SiO-$ (where Me represents a methyl group) were observed.

After the formation of the thin film, a copper thin film having a thickness of 140 nm was formed by the CVD method using a hexafluoracetylacetonate copper trimethylvinylsilane adduct as a source material.

The copper thin film was subjected to a tape peeling test to determine adhesion to the underlayer film. In contrast to the copper thin film peeling off in the case of conventional barrier metals, in this example no peeling was observed.

The substrate was also subjected to the Back side SIMS to determine the copper diffusion to the underlayer film although no copper diffusion was observed.

Alternatively, a silicon substrate including an alkylsilicon-based film with a low dielectric constant was subjected to a similar process and similar tests, instead of the above silicon substrate. The silicon substrate showed similar results as above.

Examples 28–39

The procedure of Example 27 was repeated in each of Examples 28 to 39 except that, instead of
1-diphenylphosphino-2-triethoxysilylethane used in example 27,
1-dimethylphosphino-2-triethoxysilylethane (Example 28),
1-diethylphosphino-2-triethoxysilylethane (Example 29),
1-dimethylphosphino-2-trimethoxysilylethane (Example 30),
1-diethylphosphino-2-trimethoxysilylethane (Example 31),
1-diphenylphosphino-2-trimethoxysilylethane (Example 32),
1-dimethylphosphino-3-triethoxysilylpropane (Example 33),
1-diethylphosphino-3-triethoxysilylpropane (Example 34),
1-diphenylphosphino-3-triethoxysilylpropane (Example 35),
1-diphenylphosphino-2-trichlorosilylethane (Example 36),
1-diphenylphosphino-2-trisdimethylaminosilylethane (Example 37),
1-diphenylphosphino-2-triisocyanatesilylethane (Example 38), and
1-diphenylphosphino-4-triethoxysilylethylbenzene (Example 39) were used.

As a result, a thin film having a thickness of 1.2 to 2.2 nm in which a $(R_1R_2)P-(R)_n-Si$ group bonds to the substrate via a Si—O bond was formed in each of the examples. The adhesion of the copper thin film was examined for each example using the tape peeling test. In the test, peeling of the copper thin film was not observed in any of the examples. The copper diffusion to the underlayer film was also examined using the Back side SIMS for each example, but no copper diffusion was observed in any of the examples.

Example 40

A silicon substrate with a $SiO_2$ thermal oxidation film formed on its surface was used as a substrate. The substrate having the surface subjected to a Si—OH termination treatment was placed in the reactor, and was reacted in contact with a 1% by volume of $CO_2$ supercritical fluid of 1-diphenylphosphino-2-triethoxysililethane heated to 60° C. After 1 hour, the substrate was washed with a $CO_2$ supercritical fluid still in the reactor, and was further heated in the $CO_2$ supercritical fluid at 120° C. for 4 minutes.

The surface of the substrate obtained as above was measured using a reflectometer. The measurement showed that a nearly uniform thin film having a thickness of 1.2 nm was formed.

In examining the thin film using FT-IR, peaks corresponding to $Ph_2PCH_2CH_2SiO$— were observed.

After the formation of the thin film, a copper thin film having a thickness of 100 nm was formed by the CVD method using a hexafluoracetylacetonate copper trimethylvinylsilane adduct as a source material.

The copper thin film was subjected to a tape peeling test to determine adhesion to the underlayer film. In contrast to the copper thin film peeling off in the case of conventional barrier metals, in this example no peeling was observed.

The substrate was also subjected to the Backside SIMS to determine the copper diffusion to the underlayer film although no copper diffusion was observed.

According to the present invention, there is provided an underlayer film-forming material for copper, a method for forming an underlayer film for copper, an underlayer film for copper, and a semiconductor device, which enable prevention of copper diffusion even when the thickness of the underlayer film is thinner than that of conventional barrier metals, and which enable superior adhesion to copper wiring film.

What is claimed is:

1. An underlayer film for copper, disposed on a substrate, wherein
   a $(R_1R_2)P$—$(R)_n$—Si group of the underlayer film is bonded to the substrate via an Si-O bond,
   $R_1$ and $R_2$ each represent an alkyl group,
   R represents a divalent linear organic group selected from the group consisting of an alkylene group, an aromatic ring, and an alkylene group including an aromatic ring, and
   n is an integer from 1 to 6.

2. An underlayer film for copper according to claim 1, wherein the film is formed by a method including bringing an underlayer film-forming material for copper, including a compound represented by the following formula [I], into contact with a surface of a substrate, $$(R_1R_2)P\text{---}(R)_n\text{---}Si(X_1X_2X_3) \qquad [I]$$

wherein
   at least one of $X_1$, $X_2$, and $X_3$ represents a hydrolysable group
   $R_1$ and $R_2$ each represent an alkyl group;
   R represents a divalent linear organic group selected from the group consisting of an alkylene group, an aromatic ring, and an alkylene group including an aromatic ring; and
   n represents an integer from 1 to 6.

3. A semiconductor device comprising:
   a substrate;
   an underlayer film for copper arranged on the substrate; and
   a copper wiring film, arranged on the underlayer film for copper, wherein
   an $(R_1 R_2)P$—$(R)_n$—Si group of the underlayer film is bonded to a substrate via an Si-O bond,
   $R_1$ and $R_2$ each represent an alkyl group;
   R represents a divalent linear organic group selected from the group consisting of an alkylene group, an aromatic ring, and an alkylene group including an aromatic ring; and
   n is an integer from 1 to 6.

* * * * *